US011072872B2

(12) United States Patent
Ono

(10) Patent No.: US 11,072,872 B2
(45) Date of Patent: Jul. 27, 2021

(54) CORE SHELL PARTICLE, METHOD OF PRODUCING CORE SHELL PARTICLE, AND FILM

(71) Applicant: FUJIFILM Corporation, Tokyo (JP)

(72) Inventor: Masashi Ono, Ashigara-kami-gun (JP)

(73) Assignee: FUJIFILM Corporation, Tokyo (JP)

( * ) Notice: Subject to any disclaimer, the term of this patent is extended or adjusted under 35 U.S.C. 154(b) by 377 days.

(21) Appl. No.: 15/976,382

(22) Filed: May 10, 2018

(65) Prior Publication Data

US 2018/0258553 A1 Sep. 13, 2018

Related U.S. Application Data

(63) Continuation of application No. PCT/JP2016/082406, filed on Nov. 1, 2016.

(30) Foreign Application Priority Data

Nov. 12, 2015 (JP) .............................. JP2015-221962

(51) Int. Cl.

| C30B 29/60 | (2006.01) |
| C01G 15/00 | (2006.01) |
| C09K 11/08 | (2006.01) |
| B82Y 40/00 | (2011.01) |
| C09K 11/70 | (2006.01) |
| B82Y 20/00 | (2011.01) |
| C09K 11/02 | (2006.01) |
| C09K 11/88 | (2006.01) |
| C30B 7/00 | (2006.01) |
| H01L 33/24 | (2010.01) |
| H01S 5/34 | (2006.01) |

(52) U.S. Cl.
CPC .............. *C30B 29/60* (2013.01); *B82Y 20/00* (2013.01); *B82Y 40/00* (2013.01); *C01G 15/00* (2013.01); *C09K 11/02* (2013.01); *C09K 11/025* (2013.01); *C09K 11/08* (2013.01); *C09K 11/0883* (2013.01); *C09K 11/70* (2013.01); *C09K 11/883* (2013.01); *C30B 7/005* (2013.01); *H01L 33/24* (2013.01); *H01S 5/3412* (2013.01)

(58) Field of Classification Search
CPC ......... B82Y 20/00; B82Y 40/00; C09K 11/02; C09K 11/025; C09K 11/08; C09K 11/883; C09K 11/70
See application file for complete search history.

(56) References Cited

U.S. PATENT DOCUMENTS

| 8,153,022 | B2 * | 4/2012 | Ryowa | ................... | C09K 11/02 |
| | | | | | 252/301.33 |
| 9,196,682 | B2 * | 11/2015 | Jang | ....................... | B82Y 10/00 |
| 9,701,897 | B2 * | 7/2017 | Xu | ............................. | C08F 2/44 |

| 2011/0017951 | A1 | 1/2011 | Ryowa |
| 2011/0084250 | A1 | 4/2011 | Jang et al. |
| 2011/0212561 | A1 | 9/2011 | Banin et al. |
| 2013/0092885 | A1 | 4/2013 | Cho et al. |
| 2014/0155640 | A1 | 6/2014 | Pickett et al. |
| 2018/0155623 | A1 | 6/2018 | Guo et al. |
| 2018/0201834 | A1 | 7/2018 | Banin et al. |

FOREIGN PATENT DOCUMENTS

| CN | 102177095 A | 9/2011 |
| CN | 103059868 A | 4/2013 |
| CN | 103154183 A | 6/2013 |
| CN | 104520228 A | 5/2015 |
| JP | 2011-26472 A | 2/2011 |
| JP | 2011-80067 A | 4/2011 |
| JP | 2011-231141 A | 11/2011 |
| JP | 5137825 B2 | 2/2013 |

OTHER PUBLICATIONS

Japanese Office Action, dated Jul. 2, 2019, for corresponding Japanese Application No. 2017-550273, along with an English translation.
Korean Office Action, dated Sep. 25, 2019, for corresponding Korean Application No. 10-2018-7013346, with and English translation.
Japanese Decision of Refusal dated Feb. 18, 2020, for corresponding Japanese Patent Application No. 2017-550273, with English translation.
Korean Office Action, dated May 25, 2020, for corresponding Korean Application No. 10-2018-7013346, with and English translation.
Extended European Search Report, dated Sep. 26, 2018, for corresponding European Application No. 16864079.5.
European Office Action, dated Jan. 14, 2020, for corresponding European Application No. 16864079.5.
European Office Action dated Jul. 25, 2019, for corresponding European Patent Application No. 16864079.5.
Greco et al., "InP/ZnSe/ZnS core-multishell quantum dots for improved luminescence efficiency," Nanophotonics IV, vol. 8424, May 1, 2012, pp. 842439-1-842439-9.
International Preliminary Report on Patentability and Written Opinion of the International Searching Authority (Forms PCT/IB/326, PCT/IB/373 and PCT/ISA/237) for Application No. PCT/JP2016/082406, dated May 24, 2018, with an English translation of the Written Opinion.

(Continued)

*Primary Examiner* — C Melissa Koslow
(74) *Attorney, Agent, or Firm* — Birch, Stewart, Kolasch & Birch, LLP

(57) ABSTRACT

An object of the present invention is to provide a core shell particle having high luminous efficacy and excellent durability; a method of producing the same; and a film obtained by using the core shell particle. The core shell particle of the present invention includes: a core which contains a Group III element and a Group V element; a first shell which covers at least a part of a surface of the core; and a second shell which covers at least a part of the first shell, in which at least a part of a surface of the core shell particle contains a metal-containing organic compound containing a metal element and a hydrocarbon group.

22 Claims, No Drawings

(56) References Cited

OTHER PUBLICATIONS

International Search Report and English translation (Form PCT/ISA/210) for Application No. PCT/JP2016/082406, dated Dec. 27, 2016.

Kim et al., "Highly luminescent InP/GaP/ZnS nanocrystals and their application to white light-emitting diodes," Journal of the American Chemical Society, vol. 134, No. 8, Feb. 3, 2012, pp. 3804-3809.

Kim et et al., "Reverse Type-I ZnSe/InP/ZnS Core/Shell/Shell Nanocrystals: Cadmium-Free Quantum Dots for Visible Luminescence," Small, vol. 7, No. 1, 2011, pp. 70-73.

Murray et al., "Synthesis and characterization of nearly monodisperse CdE (E=S, Se, Te) semiconductor nanocrystallites," Journal of the American Chemical Society, vol. 115, 1993, pp. 8706-8715.

Thuy et al., "Luminescence properties of In(Zn)P alloy core/ZnS shell quantum dots," Applied Physics Letters, vol. 97, 2010, pp. 193104-1-193104-3.

Xi et al., "Understanding the role of single molecular ZnS precursors in the synthesis of In(Zn)P/ZnS nanocrystals," ACS Applied Materials & Interfaces, vol. 6, No. 20, Sep. 24, 2014, pp. 18233-18242.

Korean Notice of Final Rejection dated Mar. 26, 2020, for corresponding Korean Patent Application No. 10-2018-7013346, with an English translation.

European Office Action for corresponding European Application No. 16864079.5, dated Sep. 4, 2020.

Chinese Office Action and Search Report for corresponding Chinese Application No. 201680066038.6, dated Jun. 17, 2020, with an English translation.

Chinese Office Action for corresponding Chinese Application No. 201680066038.6, dated Jan. 12, 2021, with English translation.

Taiwanese Office Action and Search Report for corresponding Taiwanese Application No. 105136064, dated Jan. 11, 2021, with partial English translation.

Taiwanese Decision of Refusal, dated Mar. 30, 2021, for corresponding Taiwanese Application No. 105136064, with partial English translation.

Chinese Decision of Refusal, dated Apr. 27, 2021, for corresponding Chinese Application No. 201680066038.6, with partial English translation.

\* cited by examiner

CORE SHELL PARTICLE, METHOD OF PRODUCING CORE SHELL PARTICLE, AND FILM

CROSS-REFERENCE TO RELATED APPLICATIONS

This application is a Continuation of PCT International Application No. PCT/JP2016/082406 filed on Nov. 1, 2016, which claims priority under 35 U.S.C. § 119(a) to Japanese Patent Application No. 2015-221962 filed on Nov. 12, 2015. The above application is hereby expressly incorporated by reference, in its entirety, into the present application.

BACKGROUND OF THE INVENTION

1. Field of the Invention

The present invention relates to a core shell particle, a method of producing the same, and a film containing a core shell particle.

2. Description of the Related Art

As semiconductor fine particles which are expected to be applied to colloidal semiconductor nanoparticles (so-called quantum dots), Group II-VI semiconductor fine particles or Group III-V semiconductor fine particles have been known.

The particle diameter of these semiconductor fine particles is several nanometers to several tens of nanometers.

Further, a band gap typically becomes larger as the particle diameter of particles having such a nanoscale decreases due to so-called quantum size effects, and the particles exhibit light emission in a short wavelength range such as an ultraviolet region or a near ultraviolet region.

Therefore, in order to use optical characteristics specific to the semiconductor fine particles, applications to various devices such as a piezoelectric element, an electronic device, a light-emitting element, and a laser have been researched and developed.

After suggestion of a hot soap method (also referred to as a hot injection method) which is a chemical synthesis method of quantum dots in "Synthesis and Characterization of Nearly Monodisperse CdE (E=S, Se, Te) Semiconductor Nanocrystallites" J. Am. Chem. Soc., written by C. B. Murray et al., No. 115, pp. 8706 to 8715 (1993), the research on quantum dots has been actively performed around the world.

Further, the examination of the quantum dots was performed mainly on a Group II-VI semiconductor containing a Cd element or a Pb element at the time of initial research, but the research of quantum dots which do not contain a Cd element or a Pb element has been recently suggested since the Cd element and the Pb element are substances regulated as Restriction on Hazardous Substances (Rohs) or the like (for example, JP5137825B and "Highly Luminescent InP/GaP/ZnS Nanocrystals and Their Application to White Light-Emitting Diodes" Journal of the American Chemical Society 134, written by S. Kim et al., 3804-3809 (2012).

SUMMARY OF THE INVENTION

The present inventors performed examination on core shell particles having multilayers of shell layers described in JP5137825B and "Highly Luminescent InP/GaP/ZnS Nanocrystals and Their Application to White Light-Emitting Diodes" Journal of the American Chemical Society 134, written by S. Kim et al., 3804-3809 (2012). As the result, it was found that the luminous efficacy of semiconductor nanoparticles to be obtained deteriorates in some cases or emission stability (hereinafter, also referred to as "durability") with respect to ultraviolet rays or the like deteriorates in some cases.

Accordingly, an object of the present invention is to provide a core shell particle having high luminous efficacy and excellent durability, a method of producing the same, and a film obtained by using the core shell particle.

As a result of intensive examination conducted by the present inventors in order to achieve the above-described object, in a core shell particle including: a core which contains a Group III element and a Group V element; a first shell which covers at least a part of the surface of the core; and a second shell which covers at least a part of the first shell, it was found that the luminous efficacy is high and the durability is excellent in a case where at least a part of a surface of the core shell particle contains a metal-containing organic compound containing a metal element and a hydrocarbon group, thereby completing the present invention.

In other words, it was found that the above-described object can be achieved by the following configurations.

[1] A core shell particle comprising: a core which contains a Group III element and a Group V element; a first shell which covers at least a part of a surface of the core; and a second shell which covers at least a part of the first shell, in which at least a part of a surface of the core shell particle contains a metal-containing organic compound containing a metal element and a hydrocarbon group.

[2] The core shell particle according to [1], in which the metal-containing organic compound is a fatty acid metal salt.

[3] The core shell particle according to [1] or [2], in which the metal element is a Group 12 or Group 13 metal element in the periodic table.

[4] The core shell particle according to any one of [1] to [3], in which a ratio of a peak intensity of a peak M which is present at 1500 $cm^{-1}$ or greater and less than 1600 $cm^{-1}$ to a peak intensity of a peak L which is present at 1400 $cm^{-1}$ or greater and less than 1500 $cm^{-1}$ measured by Fourier transform infrared spectroscopy is 0.30 or greater.

[5] The core shell particle according to any one of [1] to [4], in which the metal element is indium or zinc.

[6] The core shell particle according to [5], in which the metal element is zinc.

[7] The core shell particle according to any one of [1] to [6], in which the hydrocarbon group contained in the metal-containing organic compound is a hydrocarbon group having 11 to 20 carbon atoms.

[8] The core shell particle according to any one of [1] to [7], in which the hydrocarbon group contained in the metal-containing organic compound is a saturated hydrocarbon group.

[9] The core shell particle according to any one of [1] to [8], in which the Group III element contained in the core is In, and the Group V element contained in the core is any of P, N, and As.

[10] The core shell particle according to [9], in which the Group III element contained in the core is In, and the Group V element contained in the core is P.

[11] The core shell particle according to any one of [1] to [10], in which the core further contains a Group II element.

[12] The core shell particle according to [11], in which the Group II element contained in the core is Zn.

[13] The core shell particle according to any one of [1] to [12], in which the first shell contains a Group II element or a Group III element.

[14] The core shell particle according to any one of [1] to [13], in which the first shell is a Group II-VI semiconductor which contains a Group II element and a Group VI element or a Group III-V semiconductor which contains a Group III element and a Group V element.

[15] The core shell particle according to [14], in which, in a case where the first shell is the Group II-VI semiconductor, the Group II element is Zn and the Group VI element is Se or S, and in a case where the first shell is the Group III-V semiconductor, the Group III element is Ga and the Group V element is P.

[16] The core shell particle according to [14], in which the first shell is the Group III-V semiconductor, the Group III element is Ga, and the Group V element is P.

[17] The core shell particle according to any one of [1] to [16], in which the second shell is a Group II-VI semiconductor which contains a Group II element and a Group VI element or a Group III-V semiconductor which contains a Group III element and a Group V element.

[18] The core shell particle according to [17], in which the second shell is the Group II-VI semiconductor, the Group II element is Zn, and the Group VI element is S.

[19] The core shell particle according to any one of [1] to [18], in which the core, the first shell, and the second shell respectively have a crystal system having a zinc blende structure.

[20] The core shell particle according to any one of [1] to [19], in which, among the core, the first shell, and the second shell, a band gap of the core is the smallest, and the core and the first shell respectively have a type 1 band structure.

[21] A method of producing a core shell particle for synthesizing the core shell particle according to any one of [1] to [20], the method comprising: a first step of heating and stirring a solution obtained by adding a Group III raw material which contains a Group III element to a solvent containing coordination molecules; a second step of forming a core by adding a Group V raw material which contains a Group V element to the solution after the first step; a third step of forming a first shell by adding a raw material of the first shell to the solution after the second step; a fourth step of synthesizing a core shell particle by adding a raw material of a second shell to the solution after the third step to form the second shell; and a fifth step of adding a metal-containing organic compound which contains a metal element and a hydrocarbon group to the solution after the fourth step and heating the solution.

[22] The method of producing a core shell particle according to [21], in which the raw material of the second shell added in the fourth step contains a Group II raw material containing a Group II element or a Group III raw material containing a Group III element, and the amount of the metal-containing organic compound to be added in the fifth step is greater than that of the Group II raw material or the Group III raw material added in the fourth step by an amount of greater than 0.5 in terms of molar ratio.

[23] The method of producing a core shell particle according to [21] or [22], in which the heating temperature in the fifth step is in a range of 120° C. to 220° C. [24] A film which contains the core shell particle according to any one of [1] to [20].

According to the present invention, it is possible to provide a core shell particle having high luminous efficacy and excellent durability, a method of producing the same, and a film obtained by using the core shell particle.

DESCRIPTION OF THE PREFERRED EMBODIMENTS

Hereinafter, the present invention will be described in detail.

The description of constituent elements below will be occasionally made based on representative embodiments of the present invention, but the present invention is not limited to these embodiments.

In the present specification, the numerical ranges expressed using "to" indicate the ranges including the numerical values described before and after "to" as the lower limits and the upper limits.

[Core Shell Particle]

A core shell particle of the present invention is a core shell particle including a core which contains a Group III element and a Group V element; a first shell which covers at least a part of the surface of the core; and a second shell which covers at least a part of the first shell.

Further, the core shell particle of the present invention is contains a metal-containing organic compound containing a metal element and a hydrocarbon group in at least a part of the surface thereof.

In a case where the core shell particle of the present invention contains a metal-containing organic compound in at least a part of the surface thereof, luminous efficacy is increased and the durability becomes excellent.

The reason why the luminous efficacy is increased and the durability becomes excellent as described above is not clear yet, but can be assumed as follows.

First, defects in the surface of the core particle (defects at the interface between the core and the shell) or defects in the surface of the shell are considered as a factor of deterioration of the luminous efficacy and the durability of the core shell particles.

In regard to the defects in the surface of the core particle, it is considered that defects at the interface between the core and the shell can be reduced or the impact caused by the defects can be suppressed by coating the core particle with a multilayer shell and thus high luminous efficacy can be realized.

Further, in regard to the defects in the surface of the shell, it has been known that deterioration of the luminous efficacy is caused by some excitons generated in the core passing through (tunneling) the shell and being trapped by the surface of the core shell particle. Accordingly, the present inventors assumed that the phenomenon of trapping excitons is a factor of degradation of emission stability with respect to irradiation with light such as ultraviolet rays, that is, degradation of the durability and thus considered that suppression of the defects in the surface of the shell is important for improving the durability.

Here, in the core shell particle, it has been known that the surface of the shell has a ligand. Further, it has been known that, since a typical ligand contains a carboxyl group, an amino group, a thiol group, and the like, these substituents are coordinated to a cation site (for example, Zn in a Group II-VI semiconductor) of the shell.

Therefore, in the core shell particle of the present invention, it is considered that the durability is improved because the metal-containing organic compound present in at least a part of the surface thereof is bonded to an anion site (for example, S in a Group II-VI semiconductor) of the shell through a coordinate bond or an ionic bond to reinforce the defects.

From the viewpoints of further increasing the luminous efficacy and further improving the durability, in the core shell particle of the present invention, the ratio (peak M/peak L) of the peak intensity of a peak M which is present at 1500 cm$^{-1}$ or greater and less than 1600 cm$^{-1}$ to the peak intensity of a peak L which is present at 1400 cm$^{-1}$ or greater and less than 1500 cm$^{-1}$ measured by Fourier transform infrared spectroscopy (hereinafter, also referred to as "FT-IR") is preferably 0.30 or greater and more preferably in a range of 0.50 to 2.0.

Here, it is determined whether the peak M and the peak L are detected by the detection method using FT-IR in a case where measurement is carried out under the following measurement conditions.

Further, the ratio of the peak intensity between the peak M and the peak L indicates a ratio of the maximum peak intensity of the peak M to the maximum peak intensity of the peak L which is obtained by subtracting the background from each peak to be observed under the following measurement conditions.

Further, the FT-IR measurement is performed by using a sample obtained by coating a non-doped Si substrate with a dispersion liquid (solvent: toluene) containing core shell particles and drying the substrate in a nitrogen atmosphere.

<Measurement Conditions>
Measuring device: Nicolet 4700 (transmission arrangement, manufactured by Thermo Fisher Scientific)
Detector: DTGS KBr
Light source: IR
Measurement accessory: Transmission E.S.P.
Beam splitter: KBr
Measured wave number: 400 to 4000 cm$^{-1}$
Measured interval: 1.928 cm$^{-1}$
Number of times of scanning: 32
Resolution: 4

[Core]

The core contained in the core shell particle of the present invention is a so-called Group III-V semiconductor that contains a Group III element and a Group V element.

<Group III Element>

Specific examples of the Group III element include indium (In), aluminum (Al), and gallium (Ga). Among these, In is preferable.

<Group V Element>

Specific examples of the Group V element include phosphorus (P), nitrogen (N), and arsenic (As). Among these, P is preferable.

In the present invention, a Group III-V semiconductor obtained by appropriately combining the Group III element and the Group V element exemplified above can be used as the core, but InP, InN, or InAs is preferable from the viewpoint that the luminous efficacy is further increased, the emission half-width is narrowed, and a clear exciton peak is obtained. Among these, from the viewpoint of further increasing the luminous efficacy, InP is more preferable.

In the present invention, it is preferable that the core further contains a Group II element in addition to the Group III element and the Group V element described above. Particularly in a case where the core is InP, the lattice constant is decreased by doping Zn as the Group II element and the lattice matching performance with a shell (for example, GaP, ZnS, or the like described below) having a smaller lattice constant than that of InP becomes excellent.

[First Shell]

The first shell contained in the core shell particle of the present invention is a material that covers at least a part of the surface of the core.

Here, in the present invention, it is possible to confirm whether at least a part of the surface of the core is covered with the first shell based on composition distribution analysis according to energy dispersive X-ray spectroscopy (TEM-EDX) using a transmission electron microscope.

In the present invention, from the viewpoint of easily suppressing defects of the interface between the core and the first shell, it is preferable that the first shell contains a Group II element or a Group III element.

Further, in addition to a Group II-VI semiconductor and a Group III-V semiconductor described below, a Group II-V semiconductor (such as $Zn_3P_2$ or $Zn_3N_2$) containing a Group II element and a Group V element; or a Group III-VI semiconductor (such as $Ga_2O_3$ or $Ga_2S_3$) containing a Group III element and a Group VI element is exemplified as the first shell containing a Group II element or a Group III element.

In the present invention, from the viewpoint of obtaining an excellent crystal phase with less defects, it is preferable that the first shell is a Group II-VI semiconductor containing a Group II element and a Group VI element or a Group III-V semiconductor containing a Group III element and a Group V element and more preferable that the first shell is a Group III-V semiconductor in which a difference in lattice constant between the core described above and the first shell is small.

<Group II-VI Semiconductor>

Specific examples of the Group II element contained in the Group II-VI semiconductor include zinc (Zn), cadmium (Cd), and magnesium (Mg). Among these, Zn is preferable.

Further, specific examples of the Group VI element contained in the Group II-VI semiconductor include sulfur (S), oxygen (O), selenium (Se), and tellurium (Te). Among these, S or Se is preferable and S is more preferable.

A Group II-VI semiconductor obtained by appropriately combining the Group II element and the Group VI element described above can be used as the first shell, but it is preferable that the first shell has a crystal system (for example, a zinc blende structure) which is the same as or similar to the core described above. Specifically, ZnSe, ZnS, or a mixed crystal of these is preferable and ZnSe is more preferable.

<Group III-V Semiconductor>

Specific examples of the Group III element contained in the Group III-V semiconductor include indium (In), aluminum (Al), and gallium (Ga). Among these, Ga is preferable.

Further, specific examples of the Group V element contained in the Group III-V semiconductor include phosphorus (P), nitrogen (N), and arsenic (As). Among these, P is preferable.

A Group III-V semiconductor obtained by appropriately combining the Group III element and the Group V element described above can be used as the first shell, but it is preferable that the first shell has a crystal system (for example, a zinc blende structure) which is the same as or similar to the core described above. Specifically, GaP is preferable.

In the present invention, from the viewpoint of reducing defects of the surface of the core shell particle to be obtained, it is preferable that a difference in lattice constant between the above-described core and the first shell is small. Specifically, it is preferable that the difference in lattice constant between the above-described core and the first shell is 10% or less.

Specifically, in a case where the above-described core is InP, it is preferable that the first shell is ZnSe (difference in lattice constant: 3.4%) or GaP (difference in lattice constant: 7.1%) as described above. Particularly, it is more preferable that the first shell is the same Group III-V semiconductor as the core and the Group III-V semiconductor is GaP from the viewpoint that a mixed crystal state can be easily made on the interface between the core and the first shell.

In the present invention, in a case where the first shell is a Group III-V semiconductor, the first shell may contain or dope another element (for example, the Group II element or the Group VI element described above) within the range that does not affect the magnitude correlation (core<first shell) of the band gap between the core and the first shell. Similarly, in a case where the first shell is a Group II-VI semiconductor, the first shell may contain or dope another element (for example, the Group III element or the Group V element described above) within the range that does not affect the magnitude correlation (core<first shell) of the band gap between the core and the first shell.

[Second Shell]

The second shell contained in the core shell particle of the present invention is a material that covers at least a part of the surface of the first shell described above.

Here, in the present invention, it is possible to confirm whether at least a part of the surface of the first shell is covered with the second shell based on composition distribution analysis according to energy dispersive X-ray spectroscopy (TEM-EDX) using a transmission electron microscope.

In the present invention, from the viewpoints of suppressing defects of the interface between the first shell and the second shell and obtaining an excellent crystal phase with less defects, it is preferable that the second shell is a Group II-VI semiconductor containing a Group II element and a Group VI element or a Group III-V semiconductor containing a Group III element and a Group V element. Further, from the viewpoints of high reactivity of the material itself and easily obtaining a shell with excellent crystallinity, it is more preferable that the second shell is a Group II-VI semiconductor.

Examples of the Group II element, the Group VI element, the Group III element, and the Group V element include those described in the section of the first shell.

A Group II-VI semiconductor obtained by appropriately combining the Group II element and the Group VI element described above can be used as the second shell, but it is preferable that the second shell has a crystal system (for example, a zinc blende structure) which is the same as or similar to the core described above. Specifically, ZnSe, ZnS, or a mixed crystal of these is preferable and ZnS is more preferable.

A Group III-V semiconductor obtained by appropriately combining the Group III element and the Group V element described above can be used as the second shell, but it is preferable that the second shell has a crystal system (for example, a zinc blende structure) which is the same as or similar to the core described above. Specifically, GaP is preferable.

In the present invention, from the viewpoint of reducing defects of the surface of the core shell particle to be obtained, it is preferable that a difference in lattice constant between the above-described first shell and the second shell is small. Specifically, it is preferable that the difference in lattice constant between the above-described first shell and the second shell is 10% or less.

Specifically, in a case where the above-described first shell is GaP, it is preferable that the second shell is ZnSe (difference in lattice constant: 3.8%) or ZnS (difference in lattice constant: 0.8%) as described above and more preferable that the second shell is ZnS.

In the present invention, in a case where the second shell is a Group II-VI semiconductor, the second shell may contain or dope another element (for example, the Group III element or the Group V element described above) within the range that does not affect the magnitude correlation (core<second shell) of the band gap between the core and the second shell. Similarly, in a case where the second shell is a Group III-V semiconductor, the second shell may contain or dope another element (for example, the Group II element or the Group VI element described above) within the range that does not affect the magnitude correlation (core<second shell) of the band gap between the core and the second shell.

In the present invention, from the viewpoint that epitaxial growth becomes easy and defects of an interface between layers are easily suppressed, it is preferable that each of the core, the first shell, and the second shell described above has a crystal system having a zinc blende structure.

In the present invention, from the viewpoint that the probability of excitons remaining in the core becomes higher and the luminous efficacy is further increased, it is preferable that the band gap of the core from among the core, the first shell, and the second shell described above is the smallest and the core and the first shell are core shell particles having a type 1 band structure.

[Metal-Containing Organic Compound]

The core shell particle of the present invention contains a metal-containing organic compound containing a metal element and a hydrocarbon group in at least a part of the surface of the core shell particle, that is, at least a part of the surface of the second shell described above.

In the present invention, it is preferable that the metal-containing organic compound is an organic acid salt of a metal element. From the viewpoints of further increasing the luminous efficacy and further improving the durability, it is more preferable that the metal-containing organic compound is a fatty acid metal salt.

Examples of the metal element contained in the metal-containing organic compound include indium (In), zinc (Zn), gallium (Ga), cadmium (Cd), aluminum (Al), lithium (Li), sodium (Na), potassium (K), rubidium (Rb), cesium (Cs), beryllium (Be), magnesium (Mg), calcium (Ca), strontium (Sr), and barium (Ba).

Among these, from the viewpoints of further increasing the luminous efficacy and further improving the durability, a Group 12 or Group 13 metal element in the periodic table is preferable, In or Zn is more preferable, and Zn is still more preferable.

Further, as the hydrocarbon group contained in the metal-containing organic compound, a hydrocarbon group derived from an organic acid such as a fatty acid or a sulfonic acid is exemplified. From the viewpoints of further increasing the luminous efficacy, further improving the durability, and improving the dispersion stability in a solution, a hydrocarbon group having 11 to 20 carbon atoms is preferable and a hydrocarbon group having 14 to 18 carbon atoms is more preferable.

In addition, from the viewpoints described above, it is preferable that the hydrocarbon group contained in the metal-containing organic compound is a saturated hydrocarbon group.

As such a hydrocarbon group, an alkyl group is preferable and specific examples thereof include an undecyl group derived from lauric acid ($CH_3(CH_2)_{10}COOH$), a dodecyl group derived from tridecanoic acid ($CH_3(CH_2)_{11}COOH$), a tridecyl group derived from myristic acid ($CH_3(CH_2)_{12}COOH$), a tetradecyl group derived from pentadecanoic acid ($CH_3(CH_2)_{13}COOH$), a pentadecyl group derived from palmitic acid ($CH_3(CH_2)_{14}COOH$), a hexadecyl group derived from heptadecanoic acid ($CH_3(CH_2)_{15}COOH$), a heptadecyl group derived from stearic acid ($CH_3(CH_2)_{16}$ COOH), and a nonadecyl group derived from arachidic acid ($CH_3(CH_2)_{18}COOH$).

Further, examples of the unsaturated hydrocarbon group include a hydrocarbon group derived from oleic acid ($CH_3(CH_2)_7CH=CH(CH_2)_7COOH$).

Specific examples of the fatty acid metal salt which is a preferred example of the metal-containing organic compound include lauric acid metal salt such as lithium laurate, sodium laurate, potassium laurate, magnesium laurate, calcium laurate, or barium laurate; myristic acid metal salt such as lithium myristate, sodium myristate, potassium myristate, magnesium myristate, calcium myristate, indium myristate, or barium myristate; palmitic acid metal salt such as lithium palmitate, sodium palmitate, potassium palmitate, magnesium palmitate, calcium palmitate, or barium palmitate; stearic acid metal salt such as lithium stearate, sodium stearate, potassium stearate, magnesium stearate, calcium stearate, barium stearate, gallium stearate, cadmium stearate, indium stearate, or zinc stearate; and oleic acid metal salt such as indium oleate, gallium oleate, or zinc oleate.

[Coordination Molecule]

From the viewpoint of imparting dispersibility, it is desirable that the surface of the core shell particle of the present invention has coordination molecules.

Examples of the coordination molecules include a coordination molecule A which is represented by Formula (A) and contains a carboxyl group; and a coordination molecule B which is represented by Formula (B) and contains a mercapto group, and a combination of these is preferable.

$$R^1-COOH \quad\quad\quad (A)$$

$$R^2-SH \quad\quad\quad (B)$$

Here, in Formulae (A) and (B), $R^1$ and $R^2$ each independently represent an organic group.

As the organic group, a monovalent hydrocarbon group which may include a substituent or a heteroatom is exemplified, and examples thereof include an aliphatic hydrocarbon group such as an alkyl group or a cycloalkyl group; an aromatic hydrocarbon group such as an aryl group; and an unsaturated hydrocarbon group such as a vinyl group or an allyl group.

From the viewpoint of preventing aggregation, as the organic group represented by $R^1$ and $R^2$ in Formulae (A) and (B), a linear aliphatic hydrocarbon group is preferable and an aliphatic hydrocarbon group having 8 to 25 carbon atoms is more preferable.

Specific examples of the ligand A represented by Formula (A) include decanoic acid, lauric acid, myristic acid, palmitic acid, stearic acid, behenic acid, oleic acid, and erucic acid. These may be used alone or in combination of two or more kinds thereof.

Further, specific examples of the ligand B represented by Formula (B) include dodecanethiol, octanethiol, decanethiol, tetradecanethiol, hexadecanethiol, HS—$(CH_2)_m$—OH (in the formula, m represents an integer of 11 to 16), and HS—$(CH_2)_m$—(O—$CH_2CH_2$)$_n$—$OCH_3$ (in the formula, m represents an integer of 11 to 16, and n represents an integer of 3 to 6). These may be used alone or in combination of two or more kinds thereof.

[Average Particle Diameter]

From the viewpoints of easily synthesizing particles having a uniform size and easily controlling the emission wavelength using quantum size effects, the average particle diameter of the core shell particles of the present invention is preferably 2 nm or greater and more preferably 10 nm or less.

Here, the average particle diameter is a value obtained by directly observing at least 20 particles using a transmission electron microscope, calculating the diameters of circles having the same area as the projected area of the particles, and arithmetically averaging these values.

[Method of Producing Core Shell Particles]

A method of producing a core shell particle for synthesizing the core shell particle according to the present invention described above (hereinafter, also referred to as the "production method of the present invention") includes a first step of heating and stirring a solution obtained by adding a Group III raw material which contains a Group III element to a solvent containing coordination molecules; a second step of forming a core by adding a Group V raw material which contains a Group V element to the solution after the first step; a third step of forming a first shell by adding a raw material of the first shell to the solution after the second step; a fourth step of synthesizing core shell particle by adding a raw material of a second shell to the solution after the third step to form the second shell; and a fifth step of adding a metal-containing organic compound which contains a metal element and a hydrocarbon group to the solution after the fourth step and heating the solution.

Here, examples of the Group III element and the Group V element are the same as those described in the section of the core shell particle of the present invention described above.

Hereinafter, raw materials and conditions of each treatment step will be described in detail.

[First Step]

The first step is a step of heating and stirring a solution obtained by adding a Group III raw material which contains a Group III element to a solvent containing coordination molecules.

<Coordination Molecule>

Examples of the coordination molecule used in the first step are the same as those described in the section of the core shell particle of the present invention described above. Among those, from the viewpoints of promoting the synthesis of the core and having an appropriate coordination force with respect to the core, oleic acid, palmitic acid, myristic acid, and stearic acid are preferable.

<Solvent>

Preferred examples of the solvent used in the first step include non-polar solvents having a boiling point of 170° C. or higher.

Examples of the non-polar solvents include aliphatic saturated hydrocarbon such as n-decane, n-dodecane, n-hexanedecane, or n-octadecane; aliphatic unsaturated hydrocarbon such as 1-undecene, 1-dodecene, 1-hexadecene, or 1-octadecene; and trioctylphosphine.

Among these, aliphatic unsaturated hydrocarbon having 12 or greater carbon atoms is preferable and 1-octadecene is more preferable.

<Group III Raw Material>

Specific examples of the Group III raw material to be added to the solvent containing the coordination molecule described above include indium acetate, indium chloride, indium oxide, indium nitrate, indium sulfate, and indium acid; aluminum phosphate, aluminum acetylacetonate, aluminum chloride, aluminum fluoride, aluminum oxide, aluminum nitrate, and aluminum sulfate; and gallium acetylacetonate, gallium chloride, gallium fluoride, gallium oxide, gallium nitrate, and gallium sulfate, and these may be used alone or in combination of two or more kinds thereof.

Among these, from the viewpoints of further improving the luminous efficacy and easily controlling the emission wavelength in a visible range, a compound containing In is preferable. Particularly, from the viewpoint that impurity ions such as a chloride are unlikely to be taken into the core and excellent crystallinity is easily realized, it is more preferable to use indium acetate.

<Group II Raw Material>

In the production method of the present invention, a Group II raw material containing a Group II element may be added together with the Group III raw material described above during the first step.

Specific examples of the Group II raw material including a Group II element include dimethyl zinc, diethyl zinc, zinc carboxylate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc acetate, and zinc sulfate.

Among these, from the viewpoints that impurities such as a chloride are not contained and the compatibility with the coordination molecule described above and the solubility in a solvent are relatively high, it is preferable to use zinc acetate, which is an acetate of Zn.

<Conditions for Heating and Stirring>

In the first step, it is preferable that the coordination molecules and the Group III raw material described above are dissolved in the solvent described above and also preferable that the coordination molecules and the Group III raw material are dissolved in the solvent by heating and stirring the solution in a temperature range of 100° C. to 180° C. At this time, it is preferable that dissolved oxygen or moisture is removed from the mixed solution, in which the coordination molecules and the Group III raw material have been dissolved, by heating the solution under reduced pressure.

Further, the time required for heating and dissolving is preferably 30 minutes or longer.

[Second Step]

The second step is a step of forming a core by adding a Group V raw material which contains a Group V element to the solution after the first step.

In the production method of the present invention, it is preferable that the molar ratio of the Group V raw material added in the second step to the Group III raw material added in the first step is smaller than 0.5. In this manner, since a large amount of metal cations are likely to be present on the surface of the core particle and coordination molecules used in the first step are easily coordinated, excellent emission characteristics are easily realized.

Further, the molar ratio indicates a molar ratio of the Group V raw material added in the second step to the Group III raw material added in the first step even in a case where a part of the Group V raw material added in the second step is used as the raw material of the first shell during the third step.

From the viewpoint that a larger amount of metal cations derived from the Group III element can be present on the surface of the core, the molar ratio of the Group V raw material added in the second step to the Group III raw material added in the first step is preferably smaller than 0.4 and preferably in a range of 0.38 to 0.25.

<Group V Raw Material>

Specific examples of the Group V raw material containing a Group V element include tristrialkylsilylphosphine, trisdialkylsilylphosphine, and trisdialkylaminophosphine; arsenic oxide, arsenic chloride, arsenic sulfate, arsenic bromide, and arsenic iodide; and nitric monooxide, nitric acid, and ammonium nitrate.

Among these, a compound containing P is preferable. As the compound, it is preferable to use tristrialkylsilylphosphine or trisdialkylaminophosphine. Specifically, it is more preferable to use tristrimethylsilylphosphine.

[Third Step]

The third step is a step of forming a first shell by adding a raw material of the first shell to the solution after the second step.

Here, as the raw material of the first shell, a Group II raw material containing the Group II element described above and a Group VI raw material containing the Group VI element described below are exemplified in a case where the first shell is the Group II-VI semiconductor; and a Group III raw material containing the Group III element described above and a Group V raw material containing the Group V element described above are exemplified in a case where the first shell is the Group III-V semiconductor described above.

Further, in a case where the first shell is the Group III-V semiconductor described above, since the Group V raw material containing a Group V element is the same raw material as the Group V raw material forming the core, a part of the Group V raw material used in the second step may be used and only the Group III raw material may be added in the third step.

<Group VI Raw Material>

Specific examples of the Group VI raw material containing a Group VI element include sulfur, alkylthiol, trialkylphosphine sulfide, trialkenylphosphine sulfide, alkylamino sulfide, alkenylamino sulfide, cyclohexyl isothiocyanate, and diethyl dithiocarbamic acid; and trialkylphosphine selenium, trialkenylphosphine selenium, alkylamino selenium, alkenylamino selenium, trialkylphosphine telluride, trialkenylphosphine telluride, alkylamino telluride, and alkenylamino telluride.

Among these, from the viewpoint of excellent dispersibility of core shell particles to be obtained, it is preferable to use alkylthiol, specifically, more preferable to use dodecanethiol or octanethiol, and still more preferable to use dodecanethiol.

Among these materials, it is preferable to use the Group III raw material and the Group V raw material.

Particularly, as the Group III raw material, it is more preferable to use a compound containing Ga (such as gallium acetylacetonate, gallium chloride, gallium fluoride, gallium oxide, gallium nitrate, or gallium sulfate) and still more preferable to use a chloride of Ga.

In addition, as the Group V raw material, it is preferable to use a part of the Group V raw material used in the second step as described above.

[Fourth Step]

The fourth step is a step of synthesizing a core shell particle by adding a raw material of a second shell to the solution after the third step to form the second shell.

Here, as the raw material of the second shell, a Group II raw material containing the Group II element described above and a Group VI raw material containing the Group VI element described above are exemplified in a case where the second shell is the Group II-VI semiconductor; and a Group III raw material containing the Group III element described above and a Group V raw material containing the Group V element described above are exemplified in a case where the second shell is the Group III-V semiconductor described above.

Among these raw materials, it is preferable to use the Group II raw material and the Group VI raw material.

Particularly, it is preferable to use a compound containing Zn (particularly, a carboxylate of Zn) as the Group II raw material.

Further, it is preferable to use alkylthiol as the Group VI raw material.

[Fifth Step]

The fifth step is a step of adding a metal-containing organic compound which contains a metal element and a hydrocarbon group to the solution after the fourth step and heating the solution and is also a step of introducing a metal-containing organic compound into at least a part of the surface of the core shell particle synthesized in the fourth step.

Here, the metal-containing organic compound is the same as described above in the section of the core shell particle of the present invention.

Further, the heating means setting the temperature during or after the addition of the metal-containing organic compound to room temperature (23° C.) or higher, and an aspect in which, in a case where the temperature of the solution in the fourth step is 240° C., the solution is cooled to a temperature of 120° C. to 220° C. in the fifth step may be exemplified.

According to the present invention, from the viewpoint of coating the surface of the core shell particle with the metal-containing organic compound to be added in the fifth step, the raw material of the second shell added in the fourth step contains a Group II raw material containing a Group II element or a Group III raw material containing a Group III element. Further, the amount of the metal-containing organic compound to be added in the fifth step is greater than that of the Group II raw material or the Group III raw material added in the fourth step by an amount of preferably greater than 0.5 and more preferably in a range of 0.7 to 10 in terms of molar ratio.

According to the present invention, the heating temperature during the addition of the metal-containing organic compound is preferably in a range of 120° C. to 220° C. and more preferably in a range of 140° C. to 180° C.

By setting the heating temperature to 120° C. or higher, the metal-containing organic compound is likely to be bonded to an anion site (for example, a S element) on the surface of the second shell through a coordinate bond or an ionic bond. Further, by setting the heating temperature to 220° C. or lower, thermal decomposition of the added metal-containing organic compound or a side reaction between the metal-containing organic compound and remaining materials is suppressed so that occurrence of a defect of trapping excitons can be suppressed.

[Film]

The film of the present invention is a film containing the core shell particle of the present invention described above.

Since such a film of the present invention has high luminous efficacy and excellent durability and is useful as quantum dots, the film can be applied to a wavelength conversion film used for a display, a photoelectron conversion (or wavelength conversion) film of a solar cell, a biological label, a thin film transistor, and the like. Particularly, the film of the present invention is suitably applied to a down conversion film or a down shift type wavelength conversion film which absorbs light in a shorter wave region than that of the absorption edge of quantum dots and emits light having a long wave.

Further, the film material as a base material constituting the film of the present invention is not particularly limited and may be a resin or a thin glass film.

Specific examples thereof include resin materials mainly formed of an ionomer, polyethylene, polyvinyl chloride, polyvinylidene chloride, polyvinyl alcohol, polypropylene, polyester, polycarbonate, polystyrene, polyacrylonitrile, an ethylene vinyl acetate copolymer, an ethylene-vinyl alcohol copolymer, an ethylene-methacrylic acid copolymer film, and nylon.

EXAMPLES

Hereinafter, the present invention will be described in more detail based on examples. The materials, the use amounts, the ratios, the treatment contents, and the treatment procedures described in the following examples can be changed as appropriate within the range not departing from the gist of the present invention. Therefore, the scope of the present invention should not be limitatively interpreted by the following examples.

Examples 1 to 6

32 mL of octadecene, 140 mg (0.48 mmol) of indium acetate, 48 mg (0.24 mmol) of zinc acetate, and 485 mg (1.92 mmol) of palmitic acid were added to a flask, heated and stirred at 110° C. in a vacuum, and degassed for 90 minutes while the raw materials were sufficiently dissolved.

Next, the flask was heated to 300° C. in a nitrogen flow, and 0.18 mmol of tristrimethylsilylphosphine dissolved in approximately 4 mL of octadecene was added to the flask in a case where the temperature of the solution was stabilized. Thereafter, the flask was heated for 120 minutes in a state in which the temperature of the solution was set to 230° C. It was confirmed that the color of the solution was red and particles (cores) were formed.

Next, 30 mg (0.18 mmol) of gallium chloride and 188 μL (0.6 mmol) of oleic acid which were dissolved in 8 mL of octadecene were added to the solution in a state in which the solution was heated to 200° C., and the solution was further heated for approximately 1 hour, thereby obtaining a dispersion liquid of a core shell particle precursor including InP (core) doped with Zn and GaP (first shell).

Next, the dispersion liquid was cooled to room temperature, 0.93 mmol of zinc oleate was added thereto, the dispersion liquid was heated to 240° C., and the state thereof was maintained for approximately 4 hours. Next, 1.55 ml (6.55 mmol) of dodecanethiol was added to the dispersion liquid and the state of the resulting dispersion liquid was maintained for approximately 2 hours.

Next, the obtained dispersion liquid was cooled to the temperature of the fifth step listed in Table 1, 0.8 mmol of zinc stearate was added thereto, and the state of the resulting dispersion liquid was maintained for approximately 4 hours. Thereafter, the dispersion liquid was cooled to room temperature, ethanol was added thereto, and centrifugation was performed on the dispersion liquid so that particles were precipitated. The supernatant was disposed and the resultant was dispersed in a toluene solvent.

In this manner, a toluene dispersion liquid of core shell particles including InP (core) doped with Zn, GaP (first shell) covering the surface of the core, ZnS (second shell) covering the surface of the first shell, and zinc stearate in a part of the surface of the second shell was obtained.

Example 7

A toluene dispersion liquid of core shell particles including InP (core) doped with Zn, GaP (first shell) covering the surface of the core, ZnS (second shell) covering the surface of the first shell, and indium myristate in a part of the surface of the second shell was obtained according to the same method as that in Example 1 except that 2 mmol of indium myristate was added to the dispersion liquid in place of zinc stearate after the dispersion liquid was cooled to the temperature of the fifth step listed in Table 1 and then the state of the dispersion liquid was maintained for approximately 2 hours.

Example 8

A toluene dispersion liquid of core shell particles including InP (core) doped with Zn, GaP (first shell) covering the surface of the core, ZnS (second shell) covering the surface of the first shell, and zinc oleate in a part of the surface of the second shell was obtained according to the same method as that in Example 1 except that 0.8 mmol of zinc oleate was added to the dispersion liquid in place of zinc stearate after the dispersion liquid was cooled to the temperature of the fifth step listed in Table 1 and then the state of the dispersion liquid was maintained for approximately 4 hours.

Comparative Example 1

32 mL of octadecene, 140 mg (0.48 mmol) of indium acetate, 48 mg (0.24 mmol) of zinc acetate, and 485 mg (1.92 mmol) of palmitic acid were added to a flask, heated and stirred at 110° C. in a vacuum, and degassed for 90 minutes while the raw materials were sufficiently dissolved.

Next, the flask was heated to 300° C. in a nitrogen flow, and 0.18 mmol of tristrimethylsilylphosphine dissolved in approximately 4 mL of octadecene was added to the flask in a case where the temperature of the solution was stabilized. Thereafter, the flask was heated for 120 minutes in a state in which the temperature of the solution was set to 230° C. It was confirmed that the color of the solution was red and particles (cores) were formed.

Next, 30 mg (0.18 mmol) of gallium chloride and 188 µL (0.6 mmol) of oleic acid which were dissolved in 8 mL of octadecene were added to the solution in a state in which the solution was heated to 200° C., and the solution was further heated for approximately 1 hour, thereby obtaining a dispersion liquid of a core shell particle precursor including InP (core) doped with Zn and GaP (first shell).

Next, the dispersion liquid was cooled to room temperature, 0.93 mmol of zinc oleate was added thereto, the dispersion liquid was heated to 240° C., and the state thereof was maintained for approximately 4 hours. Next, 1.55 ml (6.55 mmol) of dodecanethiol was added to the dispersion liquid and the state of the resulting dispersion liquid was maintained for approximately 2 hours.

Next, the obtained dispersion liquid was cooled to room temperature, ethanol was added thereto, and centrifugation was performed on the dispersion liquid so that particles were precipitated. The supernatant was disposed and the resultant was dispersed in a toluene solvent.

In this manner, a toluene dispersion liquid of core shell particles including InP (core) doped with Zn, GaP (first shell) covering the surface of the core, and ZnS (second shell) covering the surface of the first shell was obtained.

Comparative Example 2

A toluene dispersion liquid of core shell particles including InP (core) doped with Zn, GaP (first shell) covering the surface of the core, ZnS (second shell) covering the surface of the first shell, and stearic acid in a part of the surface of the second shell was obtained according to the same method as that in Example 1 except that 0.8 mmol of stearic acid was added to the dispersion liquid in place of zinc stearate after the dispersion liquid was cooled to the temperature of the fifth step listed in Table 1 and then the state of the dispersion liquid was maintained for approximately 4 hours.

[FT-IR]

With each of the prepared dispersion liquids, the presence of the peak L present at 1400 $cm^{-1}$ or greater and less than 1500 $cm^{-1}$ and the peak M present at 1500 $cm^{-1}$ or greater and less than 1600 $cm^{-1}$ detected by FT-IR and the ratio between the peak intensities (peak M/peak L) were measured according to the above-described method. The results thereof are listed in Table 1.

[Luminous Efficacy]

<Initial Stage>

The emission intensity of each of the prepared dispersion liquids was measured using a fluorescence spectrophotometer FluoroMax-3 (manufactured by HORIBA Jobin Yvon) by adjusting the concentration thereof such that the absorbance at an excitation wavelength of 450 nm was set to 0.2. Further, the luminous efficacy was calculated by performing relative comparison with a quantum dot sample whose luminous efficacy was known. The obtained luminous efficacy was calculated as a ratio of the number of emission photons to the number of absorption photons from excitation light. The results are listed in Table 1.

<After Irradiation with Ultraviolet Rays>

Each of the prepared dispersion liquids was irradiated with ultraviolet rays by fixing a mercury lamp (wavelength of 365 nm) at a position of 1 $mW/cm^2$. Further, the time for irradiating each solution with ultraviolet rays was set to 105 minutes and the irradiation amount was set to 6.3 $J/cm^2$.

Thereafter, the luminous efficacy was measured in the same manner as that for the initial stage. The results are listed in Table 1.

TABLE 1

|  | Fifth step | | FT-IR | | | Luminous efficacy (%) | |
| --- | --- | --- | --- | --- | --- | --- | --- |
|  | Temperature (° C.) | Metal-containing organic compound or the like | Peak L *1 | Peak M *2 | Ratio between peak intensities (peak M/peak L) | Initial stage | After irradiation with ultraviolet rays |
| Example 1 | 120 | Zinc stearate | Present | Present | 0.87 | 86.5 | 78.8 |
| Example 2 | 140 | Zinc stearate | Present | Present | 0.82 | 86.1 | 83.4 |
| Example 3 | 160 | Zinc stearate | Present | Present | 0.85 | 90.6 | 88.9 |
| Example 4 | 180 | Zinc stearate | Present | Present | 0.97 | 85.7 | 81.9 |
| Example 5 | 200 | Zinc stearate | Present | Present | 0.89 | 91.3 | 86.6 |
| Example 6 | 220 | Zinc stearate | Present | Present | 0.95 | 88.1 | 79.6 |

TABLE 1-continued

| | Fifth step | | FT-IR | | | Luminous efficacy (%) | |
|---|---|---|---|---|---|---|---|
| | Temperature (° C.) | Metal-containing organic compound or the like | Peak L *1 | Peak M *2 | Ratio between peak intensities (peak M/ peak L) | Initial stage | After irradiation with ultraviolet rays |
| Example 7 | 180 | Indium myristate | Present | Present | 0.71 | 87.4 | 84.3 |
| Example 8 | 160 | Zinc oleate | Present | Present | 0.76 | 87.2 | 82.7 |
| Comparative Example 1 | — | — | Present | Present | 0.20 | 87.2 | 65.0 |
| Comparative Example 2 | 180 | Stearic acid | Present | Present | 0.21 | 82.4 | 58.1 |

*1: Peak present at 1400 cm$^{-1}$ or greater and less than 1500 cm$^{-1}$
*2: Peak present at 1500 cm$^{-1}$ or greater and less than 1600 cm$^{-1}$ Based on the results listed in Table 1, it was understood that the luminous efficacy in the initial stage was high, but the luminous efficacy after irradiation with ultraviolet rays was decreased by 25% or greater and the durability was low in a case where the fifth step was not performed and the metal-containing organic compound was not introduced into the surface of the core shell particle (Comparative Example 1).

Further, it was understood that the luminous efficacy in the initial stage was high, but the luminous efficacy after irradiation with ultraviolet rays was decreased by 20% or greater and the durability was low in a case where only stearic acid without a metal element was introduced in the fifth step (Comparative Example 2).

On the contrary, it was understood that the luminous efficacy was high, the luminous efficacy after irradiation with ultraviolet rays was also increased, and the durability was excellent in both cases where the metal-containing organic compound was added in the fifth step and the metal-containing organic compound was introduced into the surface of the core shell particle (Examples 1 to 8).

Particularly, based on the comparison between Examples 3 and 8, it was understood that the durability was further improved in a case where the metal-containing organic compound was a saturated aliphatic metal salt.

What is claimed is:

1. A core shell particle comprising:
    a core which contains a Group Hi element and a Group V element;
    a first shell which covers at least a part of a surface of the core; and
    a second shell which covers at least a part of the first shell,
    wherein at least a part of a surface of the core shell particle contains a metal-containing organic compound containing a metal element and a hydrocarbon group,
    wherein the metal-containing organic compound is a fatty acid metal salt, and
    wherein a ratio of a peak intensity of a peak M which is present at 1500 cm$^{-1}$ or greater and less than 1600 cm$^{-1}$ to a peak intensity of a peak L which is present at 1400 cm$^{-1}$ or greater and less than 1500 cm$_{-1}$ measured by Fourier transform infrared spectroscopy is 0.85 to 0.95.

2. The core shell particle according to claim 1, wherein the metal element is a Group 12 or Group 13 metal element in the periodic table.

3. The core shell particle according to claim 1, wherein the metal element is indium or zinc.

4. The core shell particle according to claim 3, wherein the metal element is zinc.

5. The core shell particle according to claim 1, wherein the hydrocarbon group contained in the metal-containing organic compound is a hydrocarbon group having 11 to 20 carbon atoms.

6. The core shell particle according to claim 1, wherein the hydrocarbon group contained in the metal-containing organic compound is a saturated hydrocarbon group.

7. The core shell particle according to claim 1, wherein the Group III element contained in the core is In, and the Group V element contained in the core is any of P, N, and As.

8. The core shell particle according to claim 7, wherein the Group III element contained in the core is In, and the Group V element contained in the core is P.

9. The core shell particle according to claim 1, wherein the core further contains a Group II element.

10. The core shell particle according to claim 9, wherein the Group II element contained in the core is Zn.

11. The core shell particle according to claim 1, wherein the first shell contains a Group II element or a Group III element.

12. The core shell particle according to claim 1, wherein the first shell is a Group II-VI semiconductor which contains a Group II element and a Group VI element or a Group III-V semiconductor which contains a Group III element and a Group V element.

13. The core shell particle according to claim 12, wherein, in a case where the first shell is the Group II-VI semiconductor, the Group II element is Zn and the Group VI element is Se or S, and
    in a case where the first shell is the Group III-V semiconductor, the Group III element is Ga and the Group V element is P.

14. The core shell particle according to claim 12, wherein the first shell is the Group III-V semiconductor, the Group III element is Ga, and. the Group V element is P.

15. The core shell particle according to claim 1, wherein the second shell is a Group II-VI semiconductor which contains a Group II element and a Group VI element or a Group III-V semiconductor which contains a Group III element and a Group V element.

16. The core shell particle according to claim 15, wherein the second shell is the Group II-VI semiconductor, the Group II element is Zn, and the Group VI element is S.

17. The core shell particle according to claim 1, wherein the core, the first shell, and the second shell respectively have a crystal system having a zinc blonde structure.

18. The core shell particle according to claim 1,
wherein, among the core, the first shell, and the second shell, a band gap of the core is the smallest, and the core and the first shell respectively have a type I band structure.

19. A method of producing a core shell particle for synthesizing the core shell particle according to claim I, the method comprising:
- a first step of heating and stirring a solution obtained by adding a Group III raw material which contains a Group III element to a solvent containing coordination molecules;
- a second step of forming a core by adding a Group V raw material which contains a Group V element to the solution after the first step;
- a third step of forming a first shell by adding a raw material of the first shell to the solution after the second step;
- a fourth step of synthesizing a core shell particle by adding a raw material of a second shell to the solution after the third step to form the second shell; and
- a fifth step of adding a metal-containing organic compound which contains a metal element and a hydrocarbon group to the solution after the fourth step and heating the solution.

20. The method of producing a core shell particle according to claim 19,
wherein the raw material of the second shell added in the fourth step contains a Group II raw material containing a Group II element or a Group III raw material containing a Group III element, and
the amount of the metal-containing organic compound to be added in the fifth step is greater than that of the Group II raw material or the Group III raw material added in the fourth step by an amount of greater than 0.5 in terms of molar ratio.

21. The method of producing a core shell particle according to claim 19,
wherein the heating temperature in the fifth step is in a range of 120° C. to 220° C.

22. A film which contains the core shell particle according to claim 1.

* * * * *